US006909592B2

(12) United States Patent
Seo

(10) Patent No.: US 6,909,592 B2
(45) Date of Patent: Jun. 21, 2005

(54) THIN FILM CAPACITOR AND FABRICATION METHOD THEREOF

(75) Inventor: Young-Hun Seo, Kyungki-do (KR)

(73) Assignee: Dongbuanam Semiconductor Inc., Seoul (KR)

( * ) Notice: Subject to any disclaimer, the term of this patent is extended or adjusted under 35 U.S.C. 154(b) by 0 days.

(21) Appl. No.: 10/747,109

(22) Filed: Dec. 30, 2003

(65) Prior Publication Data

US 2004/0150940 A1 Aug. 5, 2004

(30) Foreign Application Priority Data

Jan. 30, 2003 (KR) ................................ 10-2003-0006349
Jan. 30, 2003 (KR) ................................ 10-2003-0006350
Jan. 30, 2003 (KR) ................................ 10-2003-0006348

(51) Int. Cl.[7] ................................ H01G 4/228
(52) U.S. Cl. .................... 361/306.3; 361/311; 361/303; 438/239
(58) Field of Search ...................... 361/306.3, 311–313, 361/321.2, 322; 257/303, 306; 438/239, 244, 253

(56) References Cited

U.S. PATENT DOCUMENTS 5,339,212 A * 8/1994 Geffken et al. .......... 361/306.2
5,907,470 A * 5/1999 Kita et al. .................. 361/311
6,159,793 A 12/2000 Lou
6,271,084 B1 8/2001 Tu et al.
6,387,775 B1 5/2002 Jang et al.
6,426,250 B1 * 7/2002 Lee et al. ................... 438/239
6,436,787 B1 8/2002 Shih et al.
6,750,087 B2 * 6/2004 Morita et al. ............... 438/151

* cited by examiner

*Primary Examiner*—Anthony Dinkins
(74) *Attorney, Agent, or Firm*—Pillsbury Winthrop Shaw Pittman LLP

(57) ABSTRACT

The present invention is directed to a method for fabricating a thin film capacitor of a metal/insulator/metal (MIM) structure, which is capable of enabling small-sizing of a semiconductor device while maintaining electrostatic capacity of a capacitor. The method comprises the steps of: forming a heterogeneous film on a lower insulation film on a structure of a semiconductor substrate; forming a plurality of projections by selectively etching the heterogeneous film; and forming a first electrode layer, a dielectric layer, and a second electrode layer on the lower insulation including the plurality of projections in order along a surface shape of the projections such that a plurality of projecting parts are formed in the first electrode layer, the dielectric layer and the second electrode layer, respectively.

20 Claims, 11 Drawing Sheets

15'
18
17
16
12
11

THIN FILM CAPACITOR AND FABRICATION METHOD THEREOF

BACKGROUND OF THE INVENTION (a) Field of the Invention

The present invention relates to a fabrication method of a semiconductor device, and more particularly to a method for fabricating a thin film capacitor of a metal/insulator/metal (MIM) structure.

(b) Description of the Related Art

Recently, in the field of analog circuit requiring a high speed operation, semiconductor devices for realizing high capacitance have been developed. In general, since an upper electrode and a lower electrode of a capacitor are made of a conductive polysilicon in a case where the capacitor has a PIP structure where a polysilicon, an insulator, and a polysilicon are stacked in order, a natural oxide film is formed by an oxidation reaction at an interface between the upper and lower electrodes and a dielectric film, which results in reduction of the total capacitance.

To overcome this problem, the structure of capacitor has been changed to a metal/insulator/silicon (MIS) structure or a metal/insulator/metal (MIM) structure. Of these structures, since a capacitor of the MIM structure has a low specific resistance and no inner parasitic capacitance due to depletion, it is mainly used for high performance semiconductor devices.

Conventional techniques for a method for fabricating a thin film capacitor of the MIM structure are disclosed in U.S. Pat. Nos. 6,436,787, 6,426,250, 6,387,775, 6,271,084, and 6,159,793.

Hereinafter, a conventional method for fabricating a thin film capacitor of the MIM structure will be in brief described. FIG. 1 is a sectional view showing a thin film capacitor of a conventional MIM structure.

In order to fabricate the thin film capacitor of the MIM structure shown in FIG. 1, typical processes for fabricating a semiconductor device are first performed on a semiconductor substrate 1, and then a lower insulation film 2 is formed on the semiconductor substrate 1.

Next, a lower metal wire 3, a dielectric layer 4 and an upper metal wire 5 are formed in order on the lower insulation film 2.

Here, the lower metal wire 3 and the upper metal wire 5 correspond to first and second electrode layer layers, respectively, in the MIM capacitor.

Next, the upper metal wire 5 is selectively etched leaving a predetermined width, and then the dielectric layer 4 and the lower metal wire 3 is selectively etched leaving a predetermined width.

In the conventional MIM capacitor as described above, electrostatic capacity depends on a size of the upper metal wire 5.

However, as a size of device becomes reduced due to high integration of semiconductor devices, an area of the upper metal wire becomes smaller. Accordingly, there have been proposed various methods for reducing a thickness of the dielectric layer or increasing a contact area between metals while reducing an overall area without any reduction of electrostatic capacity. These methods are designed for improvement of an operation speed by increasing a coupling ratio in order to secure the electrostatic capacity.

However, with the methods for increasing the coupling ratio, there is a limit to reduction of the upper metal wire while maintaining the electrostatic capacity. Accordingly, there is a keen need for a new method.

SUMMARY OF THE INVENTION

In considerations of the above problems, it is an object of the present invention to enable small-sizing of a semiconductor device while maintaining electrostatic capacity of a capacitor.

To achieve the object, there is provided a thin film capacitor and a fabrication method thereof wherein a heterogeneous film is deposited on a lower insulation film, projections are formed by selectively etching the heterogeneous film, and then a first electrode layer layer, a dielectric layer and a second electrode layer are formed on an entire surface including surfaces of the projections and the heterogeneous film.

According to an aspect of the present invention, there is provided a thin film capacitor including a first electrode layer of a predetermined width formed on a lower insulation film on a structure of a semiconductor substrate, a dielectric layer formed on the first electrode layer, and a second electrode layer formed on the dielectric layer, wherein a plurality of projections are formed on the lower insulation film, and the first electrode layer is formed on an entire surface including surfaces of the plurality of projections and the lower insulation film such that a plurality of projecting parts are formed on surfaces of the first electrode layer, the dielectric layer and the second electrode layer.

Preferably, the plurality of projections formed on the lower insulation film comprises one of metal material, a nitride and an oxide.

Preferably, the plurality of projections is formed as a line type or a dot type.

Preferably, side walls are formed on side surfaces of the plurality of projections, the plurality of projections comprising one of metal material and an oxide, the side walls comprising an nitride.

Preferably, the plurality of projections has the shape of the side walls, the plurality of projections of the shape of the side walls comprising an oxide.

Preferably, the second electrode layer comprises one selected from a group consisting of W, Ti, TiN and Al.

According to another aspect of the present invention, a method for fabricating a thin film capacitor comprises the steps of: forming a heterogeneous film on a lower insulation film on a structure of a semiconductor substrate; forming a plurality of projections by selectively etching the heterogeneous film; and forming a first electrode layer, a dielectric layer, and a second electrode layer on the lower insulation including the plurality of projections in order along a surface shape of the projections such that a plurality of projecting parts are formed in the first electrode layer, the dielectric layer and the second electrode layer, respectively.

Preferably, in the step of forming the heterogeneous film, the heterogeneous film comprises one of a metal film, a nitride film and an oxide film.

Preferably, in the step of forming the heterogeneous film, the lower insulation film is planarized by using a chemical and mechanical polishing process, and then the heterogeneous film is formed on the planarized lower insulation film.

Preferably, in the step of forming a plurality of projections by selectively etching the heterogeneous film, a photosensitive film pattern to cover the heterogeneous film in regions to be formed with the plurality of projections is formed by applying, exposing and developing a photosensitive film on the heterogeneous film, and then the projections are formed by etching the heterogeneous film exposed using the photosensitive film pattern as a mask.

Preferably, when the projections are formed by etching the heterogeneous film, the projections are formed as one of a line type and a dot type.

Preferably, a method for fabricating a thin film capacitor further comprises a step of forming side walls on side surfaces of the projections after the step of forming the projections, wherein the heterogeneous film is formed of one of a metal film and an oxide film, and, in the step of forming the side walls, a nitride film is formed on the lower insulation film including the projections, and then the side walls formed of the nitride film are formed by etching back the nitride film such that the nitride film is left on the side surfaces of the projections.

Preferably, a method for fabricating a thin film capacitor further comprises a step of removing the projections after the step of forming the side walls, wherein the heterogeneous film is formed of a nitride film, and, in the step of forming the side walls, an oxide film is formed on the lower insulation film including the projections, and then the side walls formed of the oxide film are formed by etching back the oxide film such that the oxide film is left on the side surfaces of the projections.

Preferably, in the step of removing the projections, the projections are removed by a wet or dry etching process.

Preferably, in the step of forming the second electrode layer, one selected from a group consisting of W, Ti, TiN and Al is formed on the dielectric layer.

Preferably, a method for fabricating a thin film capacitor further comprises a step of selectively etching the second electrode layer, the dielectric layer and the first electrode layer, leaving a predetermined width, after the step of forming the first electrode layer, the dielectric layer and the second electrode layer.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A thin film capacitor and a fabrication method thereof according to preferred embodiments of the present invention will now be described in detail with reference to the accompanying drawings.

Figure 1:
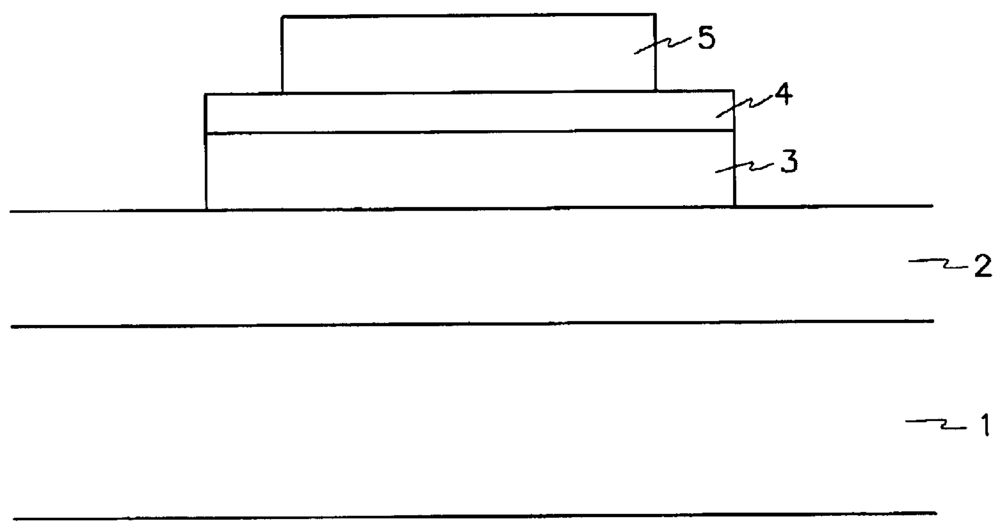
FIG. 1 is a sectional view showing a conventional thin film capacitor.
Figure 2A:
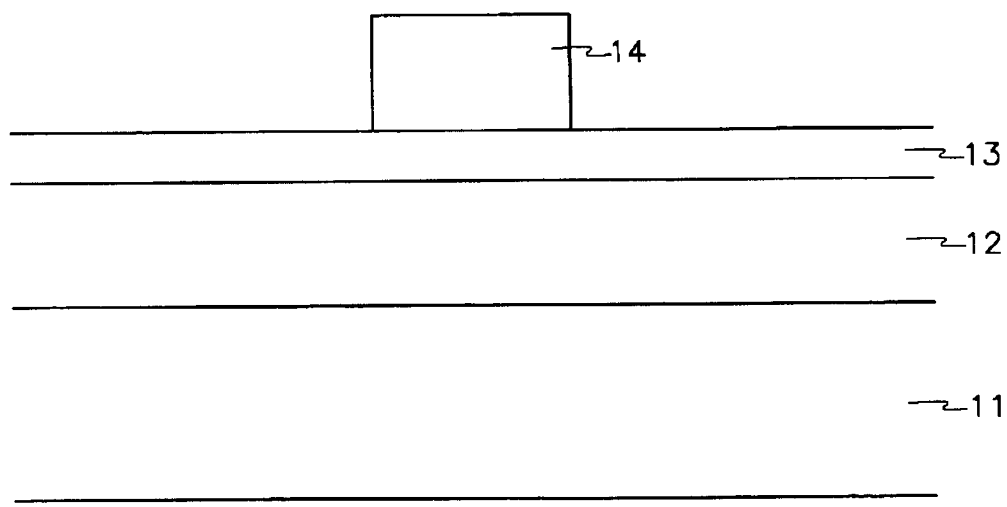
FIGS. 2*a* to 2*d* are sectional views showing a method for fabricating a thin film capacitor according to a first embodiment of the present invention.
Figure 2B:
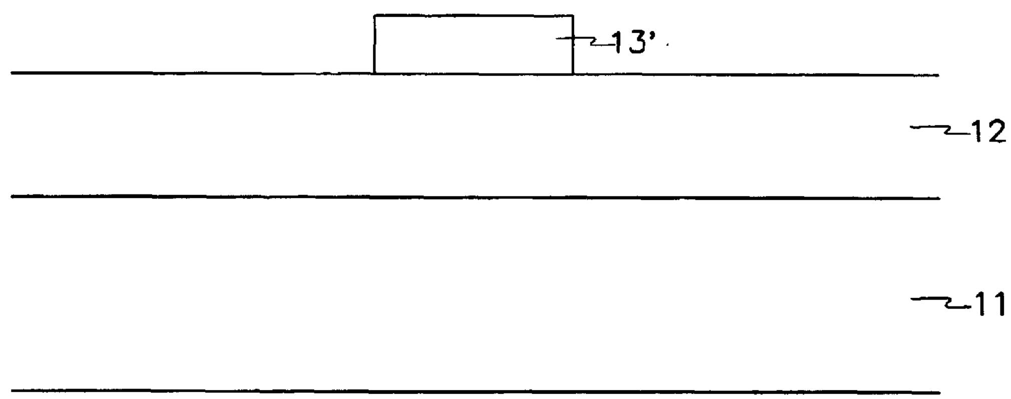
Figure 2C:
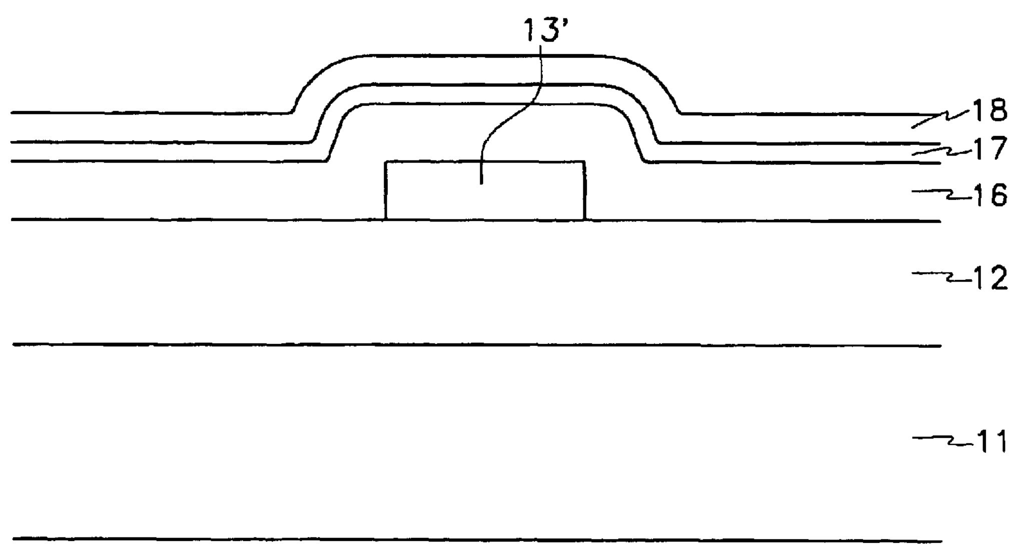
Figure 2D:
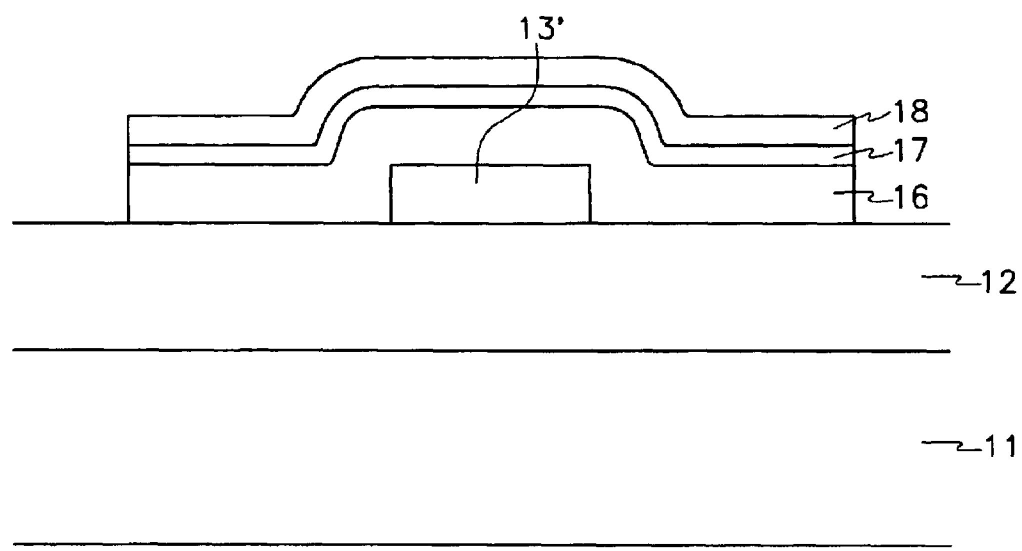
Figure 3A:
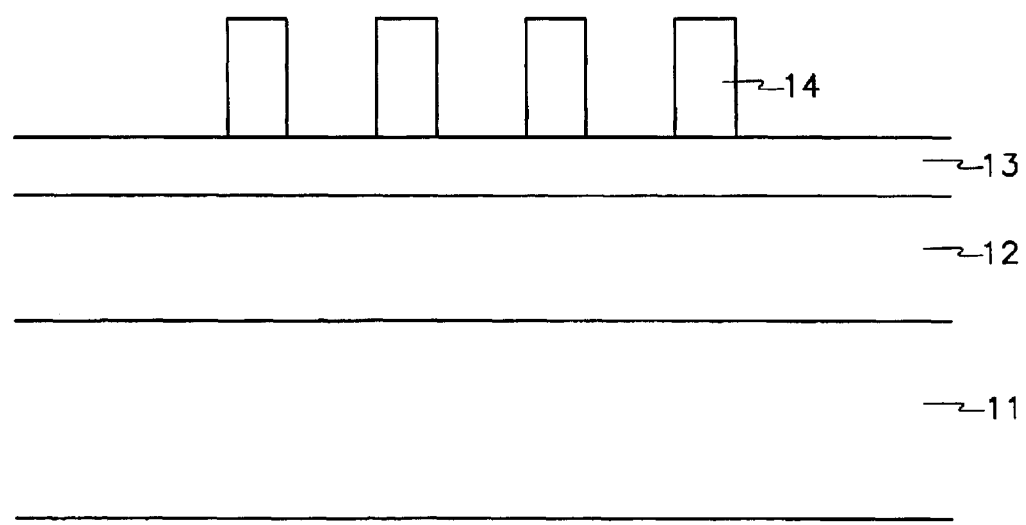
FIGS. 3*a* to 3*d* are sectional views showing a method for fabricating a thin film capacitor according to a second embodiment of the present invention.
Figure 3B:
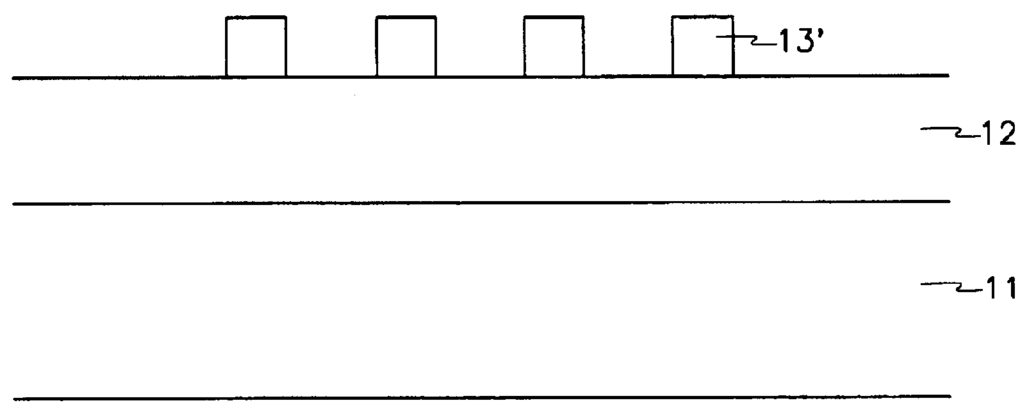
Figure 3C:
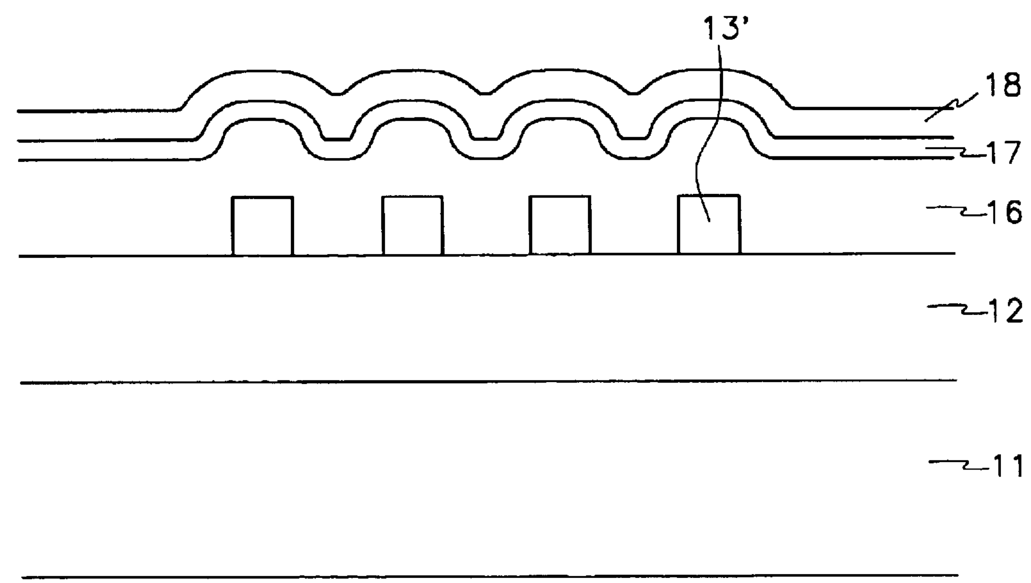
Figure 3D:
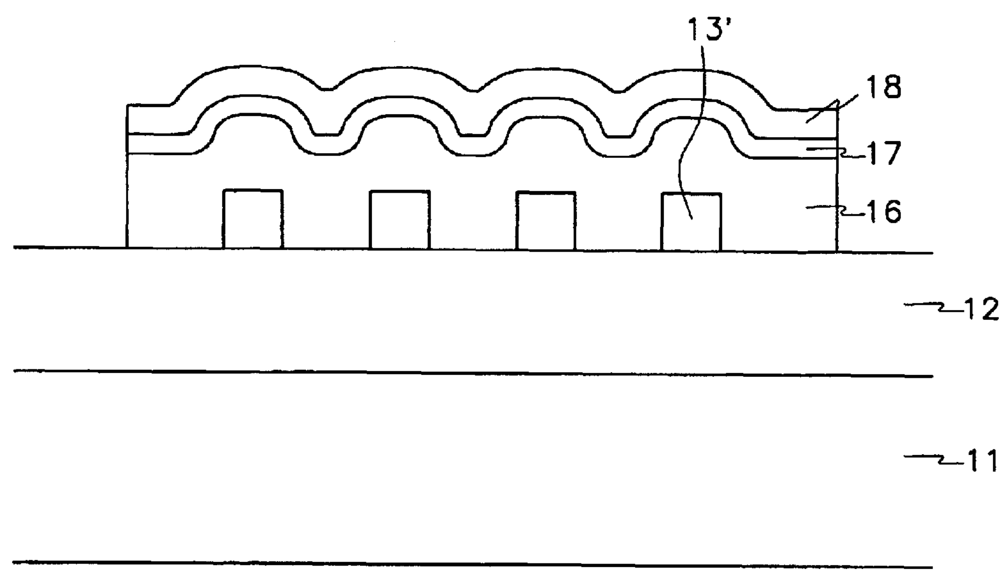

A thin film capacitor fabricated according to a first embodiment of the present invention is shown in FIG. 2*d*, and a thin film capacitor fabricated according to a second embodiment of the present invention is shown in FIG. 3*d*, where a lower insulation film 12 and a thin film capacitor are sequentially formed on a structure 11 of a semiconductor substrate in which individual elements are formed.

A projection 13' is formed on a surface of a lower insulation film 12. Here, the projection 13' can be formed by single as shown in FIG. 2*d* or by multiple as shown in FIG. 3*d*.

In addition, a thickness of the projection 13' formed on the surface of the lower insulation film 12 is adjustable to a user's need, and an edge angle of the projection 13' can be vertical, or an edge portion of the projection 13' can be formed to be a smooth curved surface. This projection 13' is preferably formed as a line type or a dot type.

A first electrode layer 16, a dielectric layer 17 and a second electrode layer 18 are formed at a predetermined width on the lower insulation film 12 including the projection 13'. At this time, a projecting part exists on surfaces of the first electrode layer 16, the dielectric layer 17 and the second electrode layer 18 due to the projection 13'.

The projections 13' can be made of metal material, a nitride, or an oxide, and the second electrode layer 18 can be made of one selected from a group consisting of W, Ti, TiN and Al.

Figure 4A:
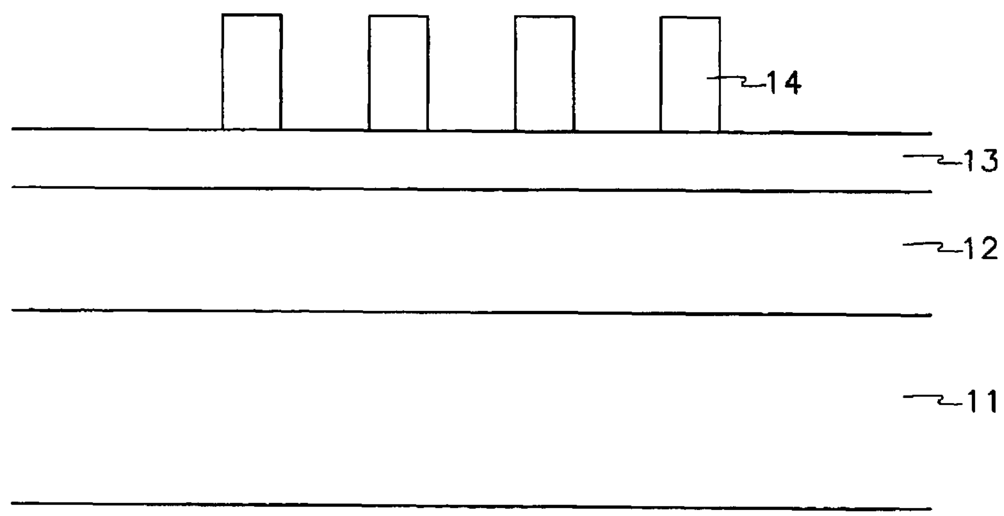
FIGS. 4*a* to 4*f* are sectional views showing a method for fabricating a thin film capacitor according to a third embodiment of the present invention.
Figure 4B:
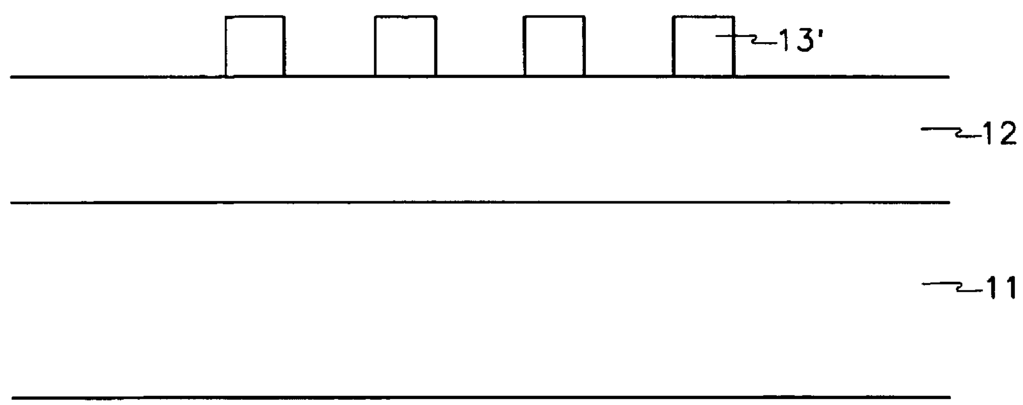
Figure 4C:
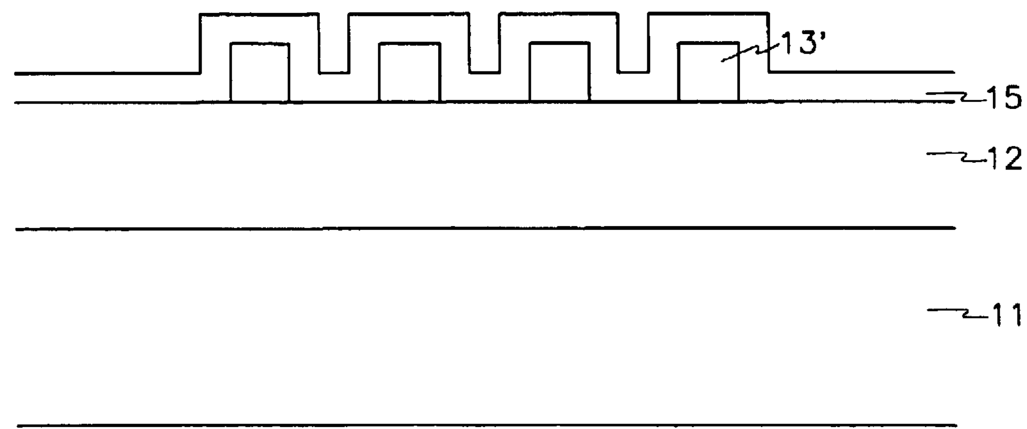
Figure 4D:
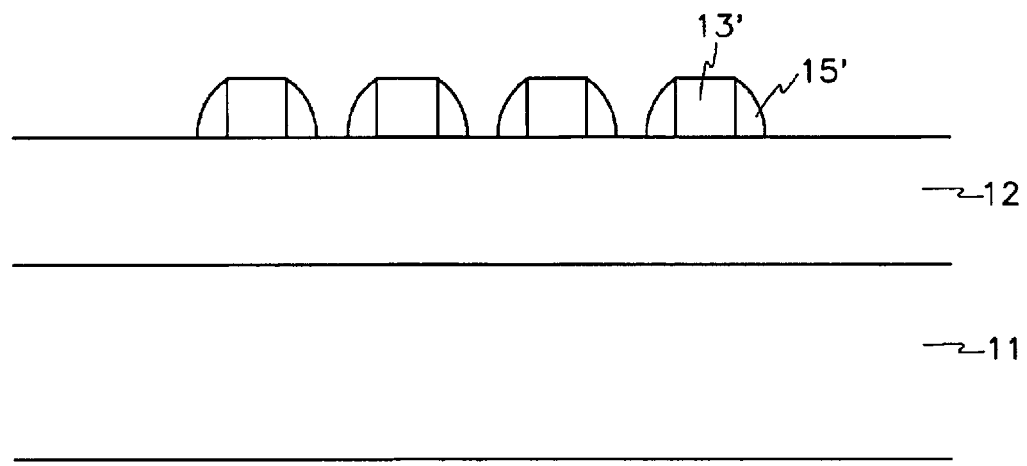
Figure 4E:
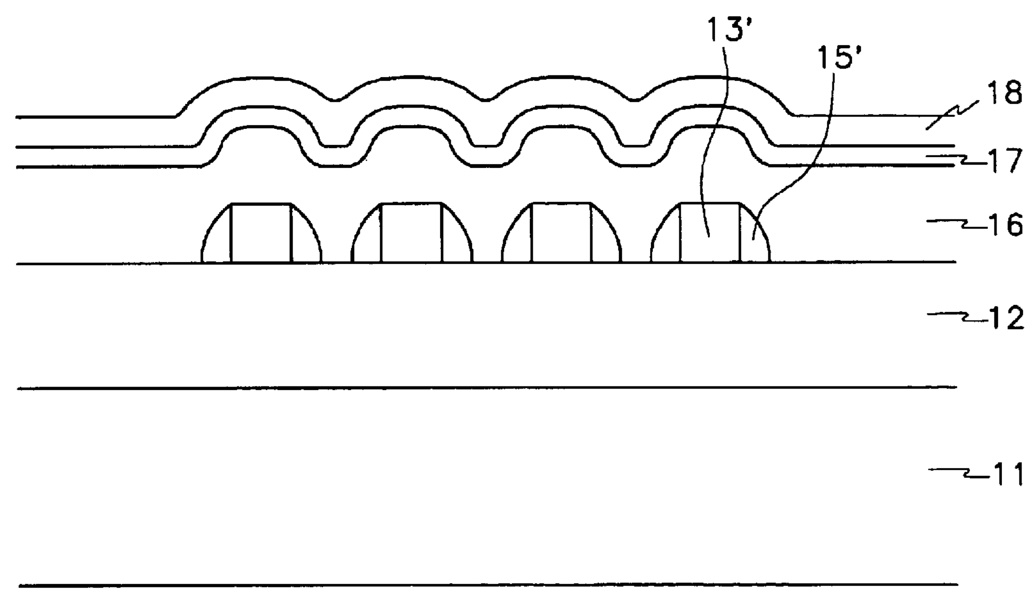
Figure 4F:
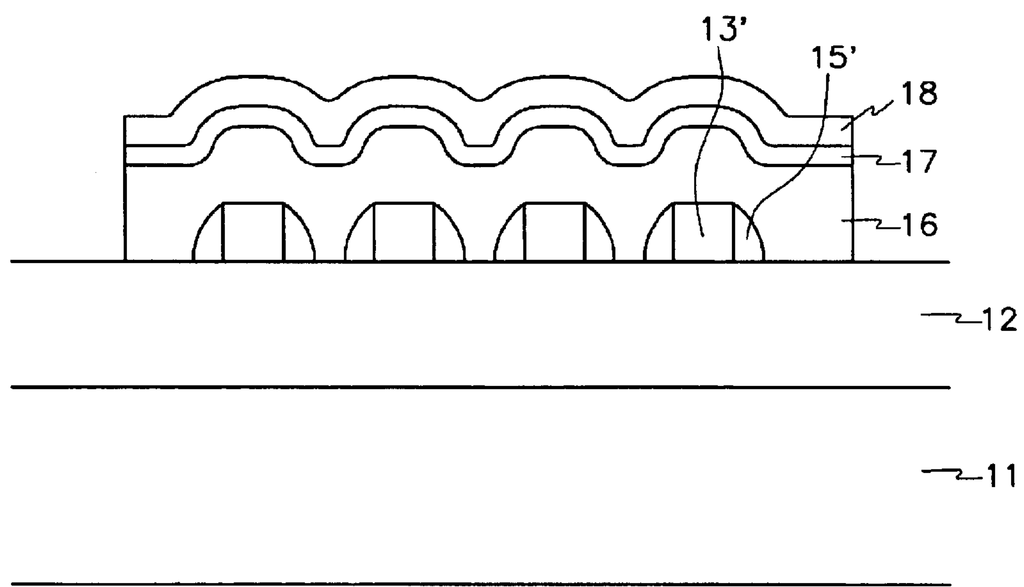
Figure 5A:
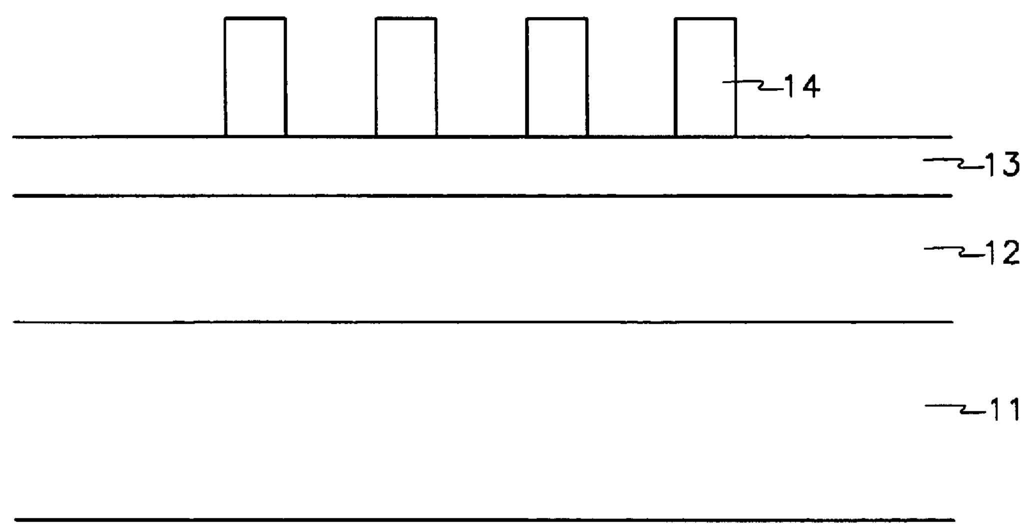
FIGS. 5*a* to 5*f* are sectional views showing a method for fabricating a thin film capacitor according to a fourth embodiment of the present invention.
Figure 5B:
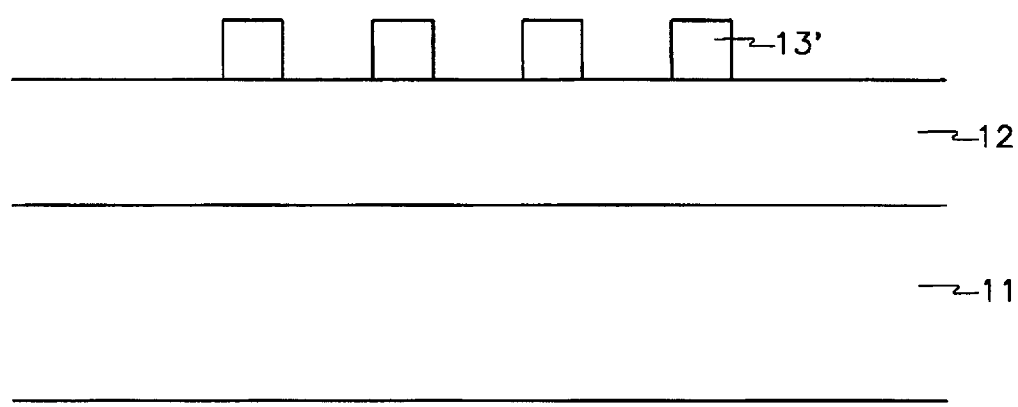
Figure 5C:
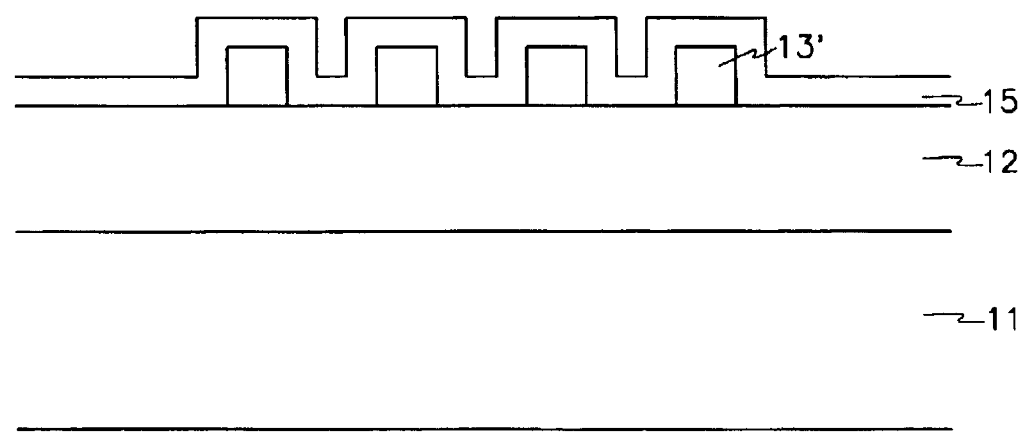
Figure 5D:
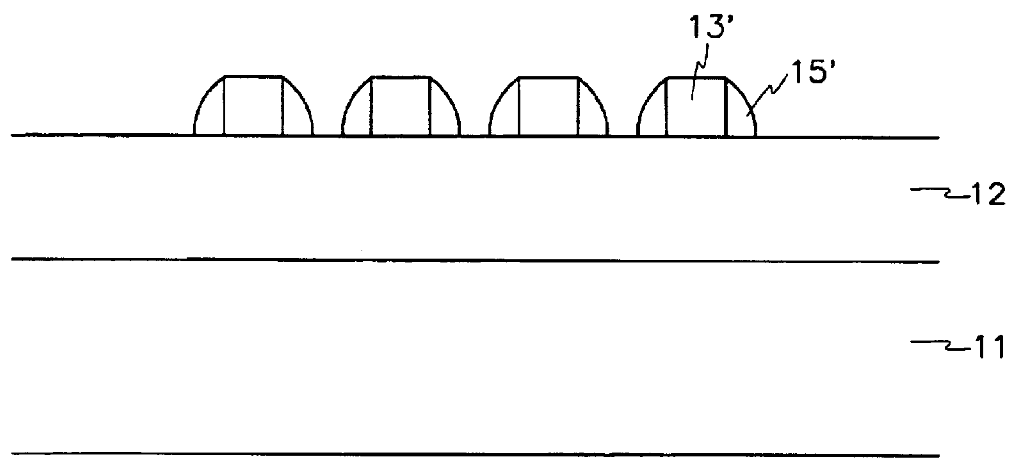
Figure 5E:
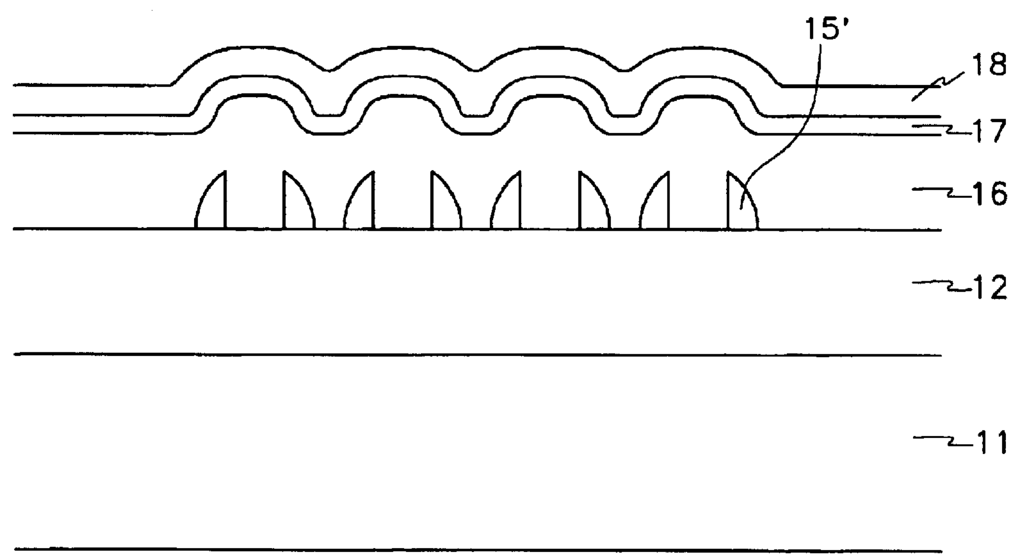
Figure 5F:
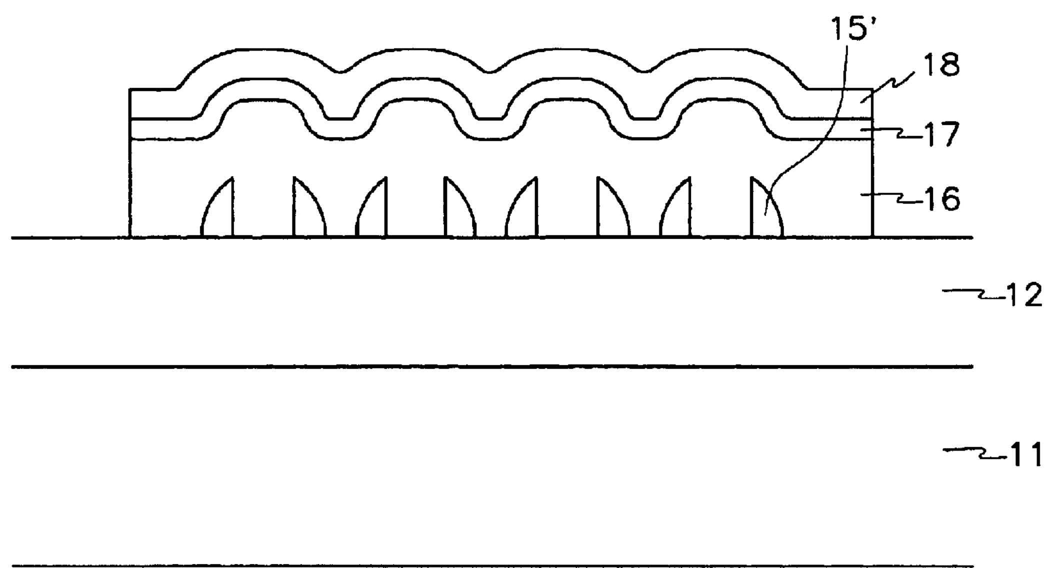

On the other hand, a thin film capacitor fabricated according to a third embodiment of the present invention is shown in FIG. 4*f*, and a thin film capacitor fabricated according to a fourth embodiment of the present invention is shown in FIG. 5*f*.

As shown in FIG. 4*f*, a side wall 15' can be formed on a side surface of the projection 13', or as shown in FIG. 5*f*, the projection 13' is removed leaving only the side wall 15' such that a projecting part can be formed on the surfaces of the first electrode 16, the dielectric layer 17 and the second electrode layer 18.

Namely, as shown in FIG. 4*f*, according to the third embodiment of the present invention, the side wall 15' is formed on the side surface of the projection 13', here, the projection 13' can be made of metal material or an oxide and the side wall 15' can be made of a nitride.

The first electrode layer 16, the dielectric layer 17 and the second electrode layer 18 are formed at a predetermined width on the lower insulation film 12 including the projection 13' and the side wall 15'. At this time, a projecting part exists on the surfaces of the first electrode layer 16, the dielectric layer 17 and the second electrode layer 18 due to the projection 13' and the side wall 15'.

In addition, as shown in FIG. 5*f*, according to the fourth embodiment of the present invention, the side wall 15' is formed to be projected from the surface of the lower insulation film 12. This side wall 15' is formed on the side surface of the projection 13', and then is left after the projection 13' is removed. In this case, the side wall 15' can be formed of an oxide film.

The first electrode 16, the dielectric layer 17 and the second electrode layer 18 are formed at a predetermined width on the lower insulation film 12 including the side wall 15'. At this time, a projecting part exists on surfaces of the first electrode layer 16, the dielectric layer 17 and the second electrode layer 18 due to the side wall 15'. Thus, the side wall 15' in the fourth embodiment of the present invention plays the same role as the projection in the first embodiment of the present invention.

Now, a method for fabricating the thin film capacitor of the present invention as described above will be in detail described.

FIGS. 2*a* to 2*d* are sectional views showing a method for fabricating a thin film capacitor according to a first embodiment of the present invention.

First, as shown in FIG. 2*a*, typical processes for fabricating a semiconductor device are first performed on a semiconductor substrate in order to form a structure 11 of the semiconductor substrate in which individual elements are formed, a lower insulation film 12 composed of an oxide film such as PSG is formed on the structure 11 of the semiconductor substrate, and then the lower insulation film 12 is planarized by using a chemical and mechanical polishing process.

Subsequently, a heterogeneous film 13 is formed on the planarized lower insulation film 12, and then a photosensitive film is applied, exposed and developed on the heterogeneous film 13 such that a photosensitive film pattern 14 to cover the lower insulation film 12, located under a region to be formed with a capacitor, by a predetermined width is formed.

At this time, the heterogeneous film 13 can be made of metal film, a nitride film, an oxide film, etc., and a thickness of the heterogeneous film 13 is adjustable to a user's need.

Next, as shown in FIG. 2*b*, a linear projection 13' is formed by etching the heterogeneous film 13 exposed using the photosensitive film pattern 14 as a mask, the photosensitive film pattern 14 is removed, and then a cleaning process is performed.

At this time, a shape of the projection 13' is adjustable to a user's need. For example, although the projection shown in FIG. 2*b* has a vertical edge angle, an edge portion of the projection can have a smooth curved surface.

Next, as shown in FIG. 2*c*, a lower metal wire 16 is formed by depositing a metal layer on the lower insulation film 12 including the projection 13'. At this time, the lower metal wire 16, which corresponds to a first electrode layer in the MIM capacitor structure, has a projecting part due to the projection 13'.

Subsequently, a dielectric layer 17 is formed on the lower metal wire 16 along a surface shape of the lower metal wire 16, and then a upper metal wire 18 is formed by depositing a metal layer such as W, Ti, TiN or Al on the dielectric layer 17 along a surface shape of the dielectric layer 17. At this time, the upper metal wire 18 corresponds to a second electrode layer in the MIM capacitor structure.

In this way, the lower metal wire 16, the dielectric layer 17 and the upper metal wire 18 have the projecting part due to the projection 13'. Namely, in the MIM capacitor structure, the MIM has a three-dimensional shape due to the projecting part, thus, a curved contact area in the MIM according to the present invention is increased, compared to a flat contact area in a conventional MIM.

In addition, electrostatic capacitance of the capacitor is adjustable by adjusting a thickness of the projection 13' formed by an adjustment of a thickness of deposition of the heterogeneous film 13.

Next, as shown in FIG. 2*d*, fabrication of the thin film capacitor having the MIM structure is completed by selectively etching the upper metal wire 18, the dielectric layer 17 and the lower metal wire 16, leaving a predetermined width.

On the other hand, FIGS. 3*a* to 3*d* are sectional views showing a method for fabricating a thin film capacitor according to a second embodiment of the present invention. As shown in these figures, in the second embodiment of the present invention, a plurality of projections 13' are formed by etching the heterogeneous film 13 using the photosensitive film pattern 14 having a pattern of a plurality of holes as a mask.

Accordingly, a plurality of projecting parts exist on surfaces of the lower metal wire 16, the dielectric layer 17 and the upper metal wire 18 formed on the heterogeneous film including the plurality of projecting parts. As described above, the second embodiment of the present invention is similar to the first embodiment of the present invention except that the plurality of projections 13' are formed.

On the other hand, FIGS. 4*a* to 4*f* are sectional views showing a method for fabricating a thin film capacitor according to a third embodiment of the present invention. Now, the third embodiment of the present invention will be in detail described with reference to these figures.

First, as shown in FIG. 4*a*, typical processes for fabricating a semiconductor device are first performed on a semiconductor substrate in order to form a structure 11 of the semiconductor substrate in which individual elements are formed, a lower insulation film 12 composed of an oxide film such as PSG is formed on the structure 11 of the semiconductor substrate, and then the lower insulation film 12 is planarized by using a chemical and mechanical polishing process.

Subsequently, a heterogeneous film 13 is formed on the planarized lower insulation film 12, and then a photosensitive film is applied, exposed and developed on the heterogeneous film 13 such that a photosensitive film pattern 14 to selectively expose the lower insulation film 12, located under a region to be formed with a capacitor, by a predetermined width is formed.

At this time, the heterogeneous film 13 can be made of a metal film or an oxide film, and a thickness of the heterogeneous film 13 is adjustable to a user's need.

Next, as shown in FIG. 4*b*, a projection 13' is formed by etching the heterogeneous film 13 exposed using the photosensitive film pattern 14 as a mask, the photosensitive film pattern 14 is removed, and then a cleaning process is performed.

At this time, the projection 13' can be formed as a line type or a dot type. In addition, although the projection shown in FIG. 4*b* has a vertical edge angle, for example, an edge portion of the projection can have a smooth curved surface.

Next, as shown in FIG. 4*c*, a nitride film 15 is deposited on the lower insulation film 12 including the projection 13'. At this time, a deposition thickness of the nitride film 15 can be adjustable considering a thickness of a side wall finally required.

Next, as shown in FIG. 4*d*, a side wall 15' is formed by etching back the nitride film 15 such that the nitride film 15 is left on only a side surface of the projection 13'.

Next, as shown in FIG. 4*e*, a lower metal wire 16 is formed by depositing a metal layer on an entire top surface of the lower insulation film 12 including the projection 13' and the side wall 15'. At this time, the lower metal wire 16, which corresponds to a first electrode layer in the MIM capacitor structure, has a projecting part due to the projection 13' and the side wall 15'.

Subsequently, a dielectric layer 17 is formed on the lower metal wire 16 along a surface shape of the lower metal wire 16, and then an upper metal wire 18 is formed by depositing a metal layer such as W, Ti, TiN or Al on the dielectric layer 17 along a surface shape of the dielectric layer 17. At this time, the upper metal wire 18 corresponds to a second electrode layer in the MIM capacitor structure.

At this time, an edge of the projecting part has a smooth curved surface due to the side wall 15' on the side surface of the projection 13', which results in deposition of uniform thickness of the dielectric layer 17.

In this way, the lower metal wire 16, the dielectric layer 17 and the upper metal wire 18 have the projecting part of the line type or the dot type due to the projection 13' and the side wall 15'. Namely, in the MIM capacitor structure, the MIM has a three-dimensional honeycombed shape due to the projecting part, thus, a curved contact area in the MIM according to the present invention is increased, compared to a flat contact area in a conventional MIM.

In addition, electrostatic capacitance of the capacitor is adjustable by adjusting a thickness of the projection 13' formed by an adjustment of a thickness of deposition of the heterogeneous film 13.

Next, as shown in FIG. **4*f*, fabrication of the thin film capacitor having the MIM structure is completed by selectively etching the upper metal wire 18, the dielectric layer 17 and the lower metal wire 16**, leaving a predetermined width.

In addition, FIGS. **5*a* to 5*f*** are sectional views showing a method for fabricating a thin film capacitor according to a fourth embodiment of the present invention. Now, the fourth embodiment of the present invention will be in detail described with reference to these figures.

First, as shown in FIG. **5*a*, typical processes for fabricating a semiconductor device are first performed on a semiconductor substrate in order to form a structure 11 of the semiconductor substrate in which individual elements are formed, a lower insulation film 12 composed of an oxide film such as PSG is formed on the structure 11 of the semiconductor substrate, and then the lower insulation film 12** is planarized by using a chemical and mechanical polishing process.

Subsequently, a heterogeneous film 13 is formed on the planarized lower insulation film 12, and then a photosensitive film is applied, exposed and developed on the heterogeneous film 13 such that a photosensitive film pattern 14 having a pattern of a plurality of holes to selectively expose the lower insulation film 12, located under a region to be formed with a capacitor, by a predetermined width is formed.

At this time, the heterogeneous film 13 can be made of a nitride film, and a thickness of the heterogeneous film 13 is adjustable to a user's need.

Next, as shown in FIG. **5*b*, a projection 13' is formed by etching the heterogeneous film 13 exposed using the photosensitive film pattern 14 as a mask, the photosensitive film pattern 14** is removed, and then a cleaning process is performed.

At this time, the projection 13' can be formed as a line type or a dot type. In addition, although the projection shown in FIG. **5*b*** has a vertical edge angle, for example, an edge portion of the projection can have a smooth curved surface.

Next, as shown in FIG. **5*c*, an oxide film 15 is deposited on the lower insulation film 12 including the projection 13'. At this time, a deposition thickness of the oxide film 15** can be adjustable considering a thickness of a side wall finally required.

Next, as shown in FIG. **5*d*, a side wall 15' is formed by etching back the oxide film 15 such that the oxide film 15 is left on only a side surface of the projection 13'**.

Next, as shown in FIG. **5*e*, the projection 13' formed of a nitride film is removed by using a wet or dry etching process. At this time, the side wall 15'** is intact left without removal.

Subsequently, a lower metal wire 16 is formed by depositing a metal layer on an entire top surface of the lower insulation film 12 including the side wall 15'. At this time, the lower metal wire 16, which corresponds to a first electrode layer in the MIM capacitor structure, has a projecting part due to the side wall 15'.

Subsequently, a dielectric layer 17 is formed on the lower metal wire 16 along a surface shape of the lower metal wire 16, and then an upper metal wire 18 is formed by depositing a metal layer such as W, Ti, TiN or Al on the dielectric layer 17 along a surface shape of the dielectric layer 17. At this time, the upper metal wire 18 corresponds to a second electrode layer in the MIM capacitor structure.

In this way, the lower metal wire 16, the dielectric layer 17 and the upper metal wire 18 have the projecting part of the line type or the dot type due to the side wall 15'. Namely, in the MIM capacitor structure, the MIM has a three-dimensional honeycombed shape due to the projecting part, thus, a curved contact area in the MIM according to the present invention is increased, compared to a flat contact area in a conventional MIM.

In addition, electrostatic capacitance of the capacitor is adjustable by adjusting a height and width of the side wall 15' formed by an adjustment of a thickness of deposition of the heterogeneous film 13 and a thickness of deposition of the oxide film 15.

Next, as shown in FIG. **5*f*, fabrication of the thin film capacitor having the MIM structure is completed by selectively etching the upper metal wire 18, the dielectric layer 17 and the lower metal wire 16**, leaving a predetermined width.

As described above, according to the present invention, since the projection is formed on the lower insulation film and the thin film capacitor of the MIM structure is formed on the lower insulation film including the projection, a contact area of the first electrode layer, the dielectric layer and the second electrode layer is increased, which results in increase of the electrostatic capacitance of the capacitor.

Accordingly, an electrostatic capacitance of a capacitor can be secured in a small-sized semiconductor device.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film capacitor comprising: a first electrode layer of a predetermined width formed on a lower insulation film on a structure of a semiconductor substrate, a dielectric layer formed on the first electrode layer, and a second electrode layer formed on the dielectric layer, wherein a plurality of projections are formed on the lower insulation film, and wherein the first electrode layer is formed on an entire surface including surfaces of the plurality of projections and the lower insulation film such that a plurality of projecting parts are formed on surfaces of the first electrode layer, the dielectric layer and the second electrode layer.

2. The thin film capacitor of claim 1, wherein the plurality of projections formed on the lower insulation film comprises one of metal material, a nitride and an oxide.

3. The thin film capacitor of claim 1, wherein the plurality of projections are formed as a line type or a dot type.

4. The thin film capacitor of claim 1, wherein side walls are formed on side surfaces of the plurality of projections.

5. The thin film capacitor of claim 4, wherein the plurality of projections comprises one of metal material and an oxide, and the side walls comprise a nitride.

6. The thin film capacitor of claim 1, wherein the plurality of projections have the shape of side walls.

7. The thin film capacitor of claim 6, wherein the plurality of projections of the shape of the side walls comprise an oxide.

8. The thin film capacitor of claim 1, wherein the second electrode layer comprises one selected from a group consisting of W, Ti, TiN and Al.

9. A method for fabricating a thin film capacitor, comprising forming a heterogeneous film on a lower insulation film on a structure of a semiconductor substrate; forming a plurality of projections by selectively etching the heterogeneous film; and forming a first electrode layer, a dielectric layer, and a second electrode layer on the lower insulation including the plurality of projections in order along a surface shape of the projections such that a plurality of projecting parts are formed in the first electrode layer, the dielectric layer and the second electrode layer, respectively.

10. The method of claim 9, wherein, in forming the heterogeneous film, the heterogeneous film comprises one of a metal film, a nitride film and an oxide film.

11. The method of claim 9, wherein, in forming the heterogeneous film, the lower insulation film is planarized by using a chemical and mechanical polishing process, and then the heterogeneous film is formed on the planarized lower insulation film.

12. The method of claim 9, wherein, in forming a plurality of projections by selectively etching the heterogeneous film, a photosensitive film pattern to cover the heterogeneous film in regions to be formed with the plurality of projections is formed by applying, exposing and developing a photosensitive film on the heterogeneous film, and then the projections are formed by etching the heterogeneous film exposed using the photosensitive film pattern as a mask.

13. The method of claim 12, wherein, when the projections are formed by etching the heterogeneous film, the projections are formed as one of a line type and a dot type.

14. The method of claim 9, further comprising forming side walls on side surfaces of the projections after forming the projections.

15. The method of claim 14, wherein the heterogeneous film is formed of one of a metal film and an oxide film, and wherein, in forming the side walls, a nitride film is formed on the lower insulation film including the projections, and then the side walls formed of the nitride film are formed by etching back the nitride film such that the nitride film is left on the side surfaces of the projections.

16. The method of claim 14, further comprising removing the projections after forming the side walls.

17. The method of claim 16, wherein the heterogeneous film is formed of a nitride film, and wherein, in forming the side walls, an oxide film is formed on the lower insulation film including the projections, and then the side walls formed of the oxide film are fanned by etching back the oxide film such that the oxide film is left on the side surfaces of the projections.

18. The method of claim 16, wherein, in removing the projections, the projections are removed by a wet or dry etching process.

19. The method of claim 9, wherein, in forming the second electrode layer, one selected from a group consisting of W, Ti, TiN and Al is fanned on the dielectric layer.

20. The method of claim 9, further comprising selectively etching the second electrode layer, the dielectric layer and the first electrode layer, leaving a predetermined width, after forming the first electrode layer, the dielectric layer and the second electrode layer.

* * * * *